United States Patent [19]

Louy et al.

[11] Patent Number: 5,594,424

[45] Date of Patent: Jan. 14, 1997

[54] INDICATING DISPLAYS FOR MOTOR VEHICLES

[75] Inventors: Jean-Franois Louy, Paris; Jean-Claude Gasquet, Saint-Clement, both of France

[73] Assignee: Valeo Vision, Bobigny Cedex, France

[21] Appl. No.: 936,042

[22] Filed: Aug. 26, 1992

[30] Foreign Application Priority Data

Sep. 2, 1991 [FR] France ................................ 91 10836

[51] Int. Cl.$^6$ ............................................... G08B 5/36
[52] U.S. Cl. .............................. 340/815.54; 340/815.42; 340/815.53
[58] Field of Search .................... 362/27, 368, 364, 362/800, 61, 64, 236; 340/815.03, 815.1, 815.17, 815.15, 815.31, 815.42, 815.33, 815.54

[56] References Cited

U.S. PATENT DOCUMENTS

| | | | |
|---|---|---|---|
| 4,306,716 | 12/1981 | James et al. | 340/815.31 X |
| 4,591,954 | 5/1986 | Kawamura et al. | 340/815.03 X |
| 4,733,335 | 3/1988 | Serizawa et al. | 362/800 X |
| 4,742,432 | 5/1988 | Thillays et al. | |
| 4,774,434 | 9/1988 | Bennion | 340/815.15 X |
| 4,964,025 | 10/1990 | Smith | 362/800 X |
| 5,001,609 | 3/1991 | Gardner et al. | 362/800 X |
| 5,068,652 | 11/1991 | Kobayashi | 340/815.31 X |

FOREIGN PATENT DOCUMENTS

| | | |
|---|---|---|
| 2481563 | 4/1980 | France . |
| 2563929 | 5/1984 | France . |
| 2601486 | 1/1988 | France . |
| 3929125 | 3/1990 | Germany . |

*Primary Examiner*—Ulysses Weldon
*Attorney, Agent, or Firm*—Morgan & Finnegan, LLP

[57] ABSTRACT

An indicating display for a motor vehicle has an optical collimating element associated with a support element carrying an array of electroluminescent diodes. The collimating element has a rear face which is engaged by the electroluminescent diodes and which is formed in steps into which through holes, each associated with a respective diode, are open.

7 Claims, 2 Drawing Sheets

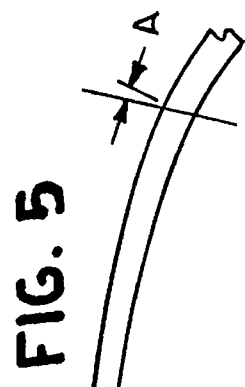
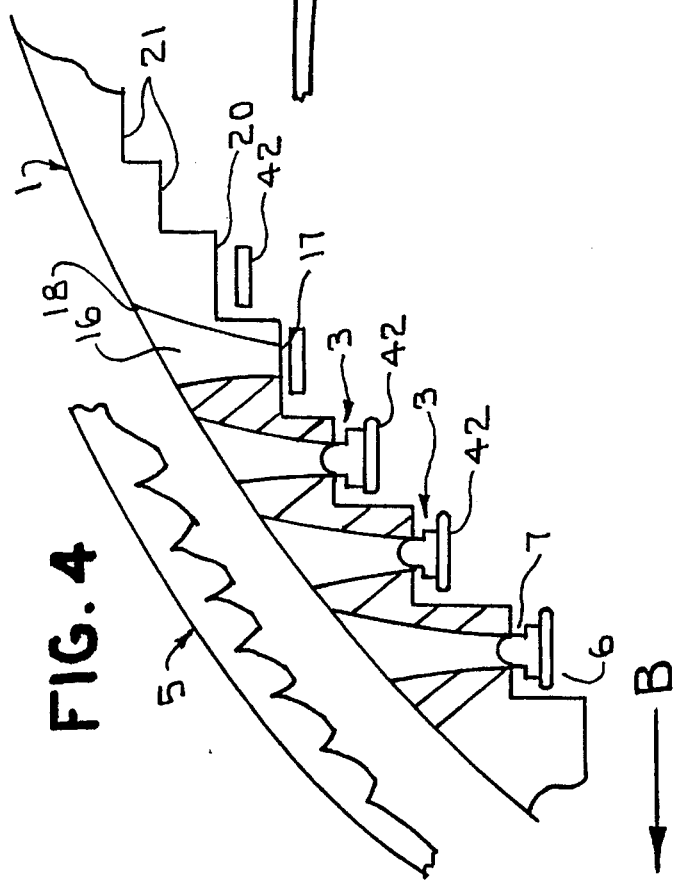
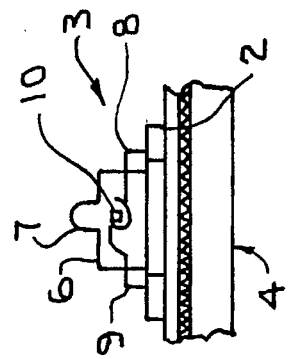
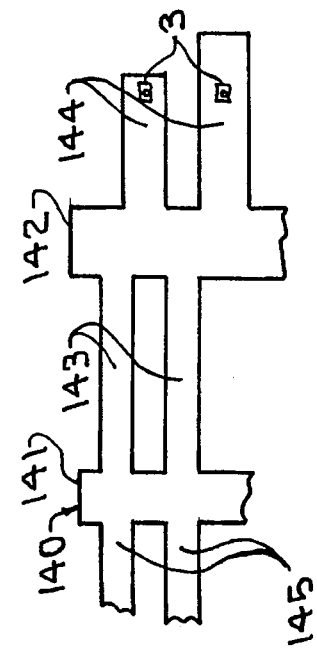

INDICATING DISPLAYS FOR MOTOR VEHICLES

FIELD OF THE INVENTION

This invention relates to indicator displays, in particular, though not exclusively, for motor vehicles and comprising an optical collimating element and a support element associated with the collimating element. The invention also relates to such collimating elements, and to such support elements in combination with the collimating elements.

BACKGROUND OF THE INVENTION

As is well known, an indicator display of conventional design is in the form of a unit comprising at least one reflector in which an incandescent or fluorescent lamp is mounted, and further comprising a transparent glass or globe which is mounted inside the reflector.

Such a display is relatively thick, and gives rise to problems of adapting it to the support on which it has to be mounted, this support being usually a corner of the vehicle or a wing. In general terms, the bulbs or other light sources are fragile, and also have a fairly short working life and a high energy consumption. For this reason, there have already been proposals for indicator displays which are compact, and which employ as the light source a semiconductor light emitting assembly in the form, for example, of electroluminescent diodes. Such arrangements enable the above mentioned disadvantages of conventional displays to be overcome and offer the possibility of providing, for example, illuminating diodes giving light in both of the colours (red and orange) that are conventionally used in motor vehicle indications, while at the same time being uncoloured when extinguished. This enables an indicator display of uniform appearance to be obtained.

A display of this kind is described for example in the specification of U.S. Pat. No. 4,742,432 and the corresponding French published patent application FR 2 574 616A, in which the electroluminescent diodes are mounted on a flat support element which is overlaid with an electronic circuit consisting of multiple components, with an optical collimating element being mounted over the said diodes. In practice this optical collimating element has a plurality of reflective parabolic cavities which are extended in insulating cylindrical openings that engage closely within conductive rings forming part of the diodes, until the insulating lower face of the said optical element comes into abutment on the support.

When the display is of non-planar, complex shape, the collimating element has to be shaped accordingly for electroluminescent diodes which then define a three-dimensional network.

This then gives rise to problems because a new shape has to be found for the optical collimating element, such that the optical performance of the display always remains excellent. This means that the electroluminescent diodes have to be located in carefully selected positions in order to give a satisfactory light. A further requirement is that the optical element must be mechanically robust and easy to manufacture.

DISCUSSION OF THE INVENTION

An object of the present invention is to overcome these problems.

In accordance with the invention, an optical collimating element for an indicator display, in particular for a motor vehicle, adapted to be associated with a support element carrying electroluminescent diodes and being of the kind having a rear face for cooperation with the said electroluminescent diodes, is characterised in that its rear face is formed in steps, into which a plurality of through holes, associated with the electroluminescent diodes, are open.

The optical collimating element in accordance with the invention is mechanically robust, and the diodes may be located in a wide variety of positions, being preferably carried by elements forming part of the support element which is a conventional component of an indicating display, these elements carrying the diodes being in the form of fingers, otherwise variously referred to as thongs or strips. The diodes can therefore be sandwiched between these fingers and the corresponding steps formed on the collimating element, and may be located at the focus or optical centre of the through holes formed in the collimating element, regardless of the complex shape of the indicator display.

In addition, manufacture of the optical collimating element is simple, for it can readily be made by moulding.

The present invention preserves the ability to assemble the components, so as to form a three-dimensional circuit, in a simple way and in the flat.

The same technique may be used for fitting additional components included in the indicating display, so as to provide functions such as multiplexing of the control for illumination of the display, or display of a symbol or character or characters (letters or numerals), by appropriate illumination of the separate light sources.

The invention thus affords a good choice of position for the light sources, but with the precision which is called for in order to obtain correct optical alignment of the light sources with respect to the outer envelope of the indicating display. The position of each light source may be calculated by a computer, with their physical location being provided by means of notches, slots or the like formed along the fingers of the support element.

Preferred embodiments of the invention will be described below, in the context of an indicating display for a motor vehicle by way of example only, and with reference to the accompanying drawings.

BRIEF DESCRIPTION OF THE DRAWINGS

FIG. 4 is a view in cross section taken on the line 4—4 in FIG. 1.

FIG. 5 is a diagrammatic view in cross section taken on the line 5—5 in FIG. 1.

FIG. 6 is a view seen in the direction of the arrow 6 in FIG. 2, showing an electroluminescent diode.

FIG. 7 shows a modification to the arrangement seen in FIG. 2.

DESCRIPTION OF PREFERRED EMBODIMENTS OF THE INVENTION

Figure 1:
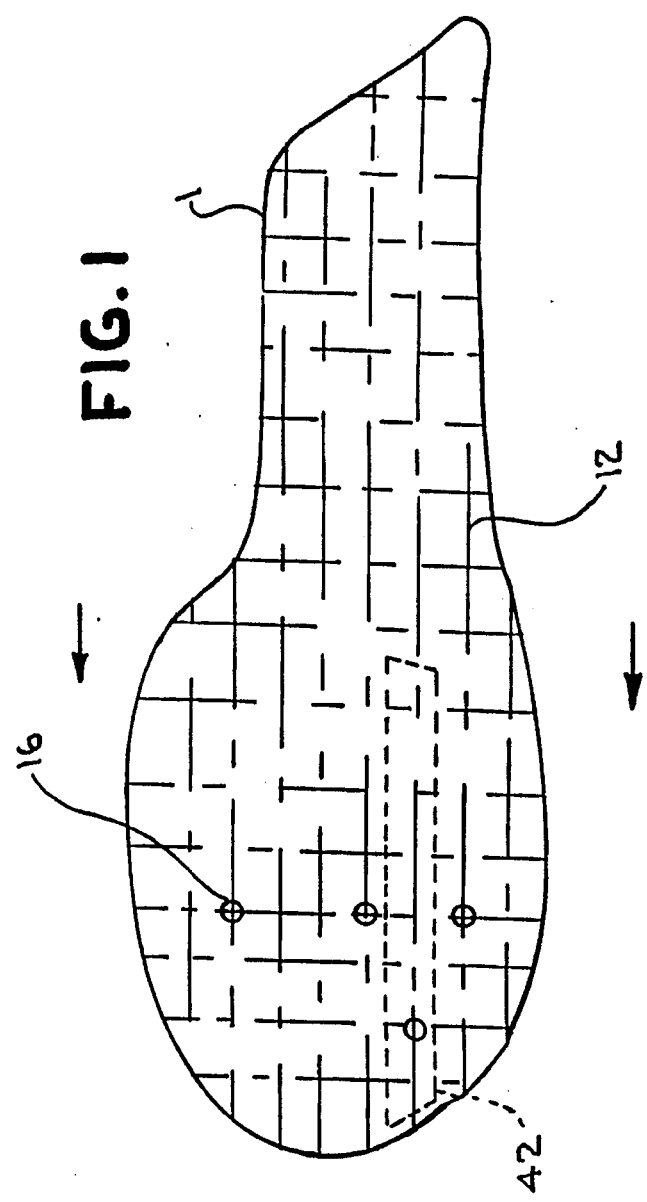
FIG. 1 is a diagrammatic front view of the optical collimating element associated with the support element in accordance with the invention.

The drawings show a support element 4 carrying an electronic circuit having multiple components 2 and 3 for an indicating display for a motor vehicle, having a non-planar and complex shape.

The support element 4 carries discrete light sources 3 in the form of discrete electroluminescent elements or discrete opto-electronic elements. These light sources will be taken in the remainder of this description to be electroluminescent diodes, and will be referred to as such, it being understood that this designation is non-limiting in terms of the scope of the invention.

Similarly, the expression "support element", or insulating support, is to be understood in this specification to mean a component made of an electrically insulating material such as the elements 1 and 4 and the support 6 to be described below.

As is shown in FIG. 1 of French patent publication No. FR 2 481 563A and in FIG. 6 of the drawings of this present Application, each electroluminescent diode 3 includes a support 6 carrying electrical supply terminals 8 and 9, together with a semi-conductor light emitter 10 and a projecting block 7 of encapsulating material, referred to here as a capsule. The capsule 7 has a penetrating head and surrounds the light emitter 10. In this example one of the supply terminals, namely the terminal 8, is a cathode having a reflector surrounding the light emitter 10, the latter being in the form of a crystal. The other supply terminal 9 is an anode. The terminals 8 and 9 are, in this example, mostly set into the support 6, which in this example is of an electrically insulating material.

In FIGS. 1 and 4 for example, a collimating element 1, which is here of an electrically insulating material, is associated with the support element 4. Like the latter, the collimating element has a complex or irregular shape. The respective shapes of the elements 1 and 4 are adapted so as to match each other. The collimating element 1 has a through hole 16 facing each capsule 7, so that there is a three-dimensional network of diodes 3 and holes 16. The supply terminals 8 and 9 of the diodes 3, and thus the diodes themselves, are interconnected through an electrical supply circuit 2. This circuit 2 is part of the electronic circuit carried by the support element 4. More precisely, it is carried by the front face of the latter that is directed towards the collimating element 1.

The support element 4, which is preferably made of an electrically insulating material, is thus overlaid by the electrical circuit 2. The circuit 2 is preferably applied by silk screen printing, in which a conductive ink is printed on to the front face of the element 4. However, in modified embodiments, it may be deposited electrochemically or electolytically.

In another modification, the electrical circuit may be formed in the manner described in the French patent publication No. FR 2 601 486A and the corresponding European patent publication No. EP 0 253 244A, with the aid of a flexible film which is applied adhesively on to the front face of the element 4 by means of an adhesive layer, with the said flexible film being coated with copper and tin. Such an arrangement can be seen in FIG. 6, in which the adhesive layer is shown in black.

The support element 4, carrying the electronic circuit with its multiple components 2 and 3 as described above, is formed with a plurality of long fingers or thongs 42, which are separated from each other. In addition, a plurality of electronic components are mounted on each of these fingers or thongs 42, at least some of these components being the electroluminescent diodes 3.

Figure 2:
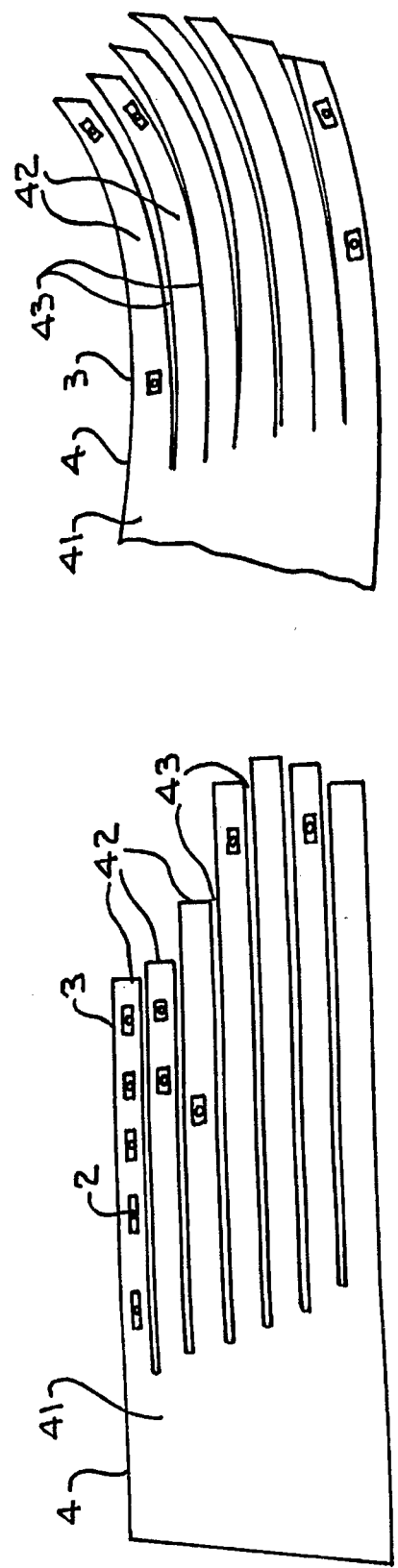
FIG. 2 is a diagrammatic view of the support element carrying other components and after being cut to form its fingers.

In the embodiment shown in FIG. 2, the support element 4 is generally in the form of a comb, in which the fingers 42 are separated from each other by slots 43. The fingers 42 are joined to a common root portion 41 at one end of the support element 4. The support element is made by taking a support element, in the form of a flat plate on which the electronic circuit comprising the various components 2, 3 has already been mounted, and making multiple cuts over part of its length so as to form the fingers 42, which remain attached to the root portion 41 through at least one of their ends.

It will be noted that in the example shown in FIG. 2, the fingers are attached at only one of their ends to the root portion 41, each of the other ends of the fingers being free.

In a second step in the method of making the support element, the fingers 42 are permanently deformed. The length of each finger 42 is calculated in advance in such a way that once they have been shaped by permanent deformation, the fingers become aligned with each other along a curve which is defined on the irregular surface with which they are associated. In this example, this irregular surface consists of bands 20 formed on the collimating element 1 (see FIG. 4), which will be described later in this description. In this example, the slots 43, together with the fingers 42, are made by mechanical sawing, or by laser cutting, mechanical shearing, or punching.

The bands 20 formed in the collimating element 1 are adapted to fit the fingers 42. More precisely, the rear or inner face of the collimating element 1 is formed with steps 21 into which the through holes 16 associated with the electroluminescent diodes 3 are open. As can be seen in FIG. 4, the bands 20 are part of the steps 21 and constitute those portions of the latter which are shown as horizontal in FIG. 4. The bands 20 are separated from each other by walls of the steps that are shown vertically in FIG. 4. The bands 20 thus constitute ledges, and it is these bands or ledges that support the diodes 3 themselves. It can thus be seen that the collimating element 1 has a mechanical function as well as an optical one, and that it is also mechanically robust.

The width of the bands 20 is adapted to the width of the fingers or thongs 42, and in this example the width of the bands 20 is in fact greater than the width of the fingers 42. As will be clear from FIG. 4, the rear face which is formed with the steps 21 is of course directed towards the support element 4 and fingers 42. It will also be seen that the rear end 17 of each through hole 16 depends on the size of the capsule 7 of the associated diode 3. The capsule may be mounted either with a clearance or without a clearance in the hole 16, and it will be noted from FIG. 4 that each of the latter is flared outwardly away from its rear end 17 intersecting the associated band 20, so that its front end 18 is of larger cross section than its rear end 17.

It will be appreciated that the rear end 17 of each through hole 16 is associated with a corresponding capsule 7, in such a way that the latter can easily be fitted in the hole without being damaged. As shown in the drawings, the capsule 7 has a penetrating nose of ogee shape, though it may of course be in the form of a half olive, or of any other suitable shape. The shape of its head, in general terms, is such as to enable the capsule to be fitted easily in the rear end 17 of the associated through hole 16, and to be centred in the latter. The capsule 7 of each diode 3 projects from the front face of its support 6, the shape of the latter being for example either cylindrical or rectangular.

Accordingly, the diodes 3 are of compact and inexpensive construction, with the width of the fingers or thongs 42 being adapted to the appropriate dimension of the diodes and other electronic components carried by the support element 4. The diodes 3 and other electronic components are fitted on the support element in portions of the latter that will subsequently become these fingers. It will be realised that the circuit 2 thus constitutes an image of the support element 4 and itself defines fingers.

The diodes 3 are secured for example by soldering or other suitable means in a melting oven, or by vacuum sputtering. Alternatively, they may be secured using a conductive adhesive paste of a kind which is subsequently polymerised. Any other fastening method may be used, for example induction heating or microwave heating, since all of the electronic components are readily surface mounted when the support element 4 is still flat, prior to its permanent deformation as described above.

It will be noted that the support element 4 is of insulating material, and may for example be of a suitable plastics material. In general terms, the support 4 is semi-rigid. It may however alternatively comprise an insulated metallic substrate. The support element 4 is adapted to be fixed to the bodywork of the motor vehicle, directly or indirectly.

The optical collimating element 1 is also of a suitable insulating material, with an irregular shape. It is preferably made of a suitable plastics material. The through holes 16 define axes of symmetry forming a rectangular grid as indicated in FIG. 1. Thus the through holes 16 define a three-dimensional network of holes.

In the form shown in the drawings, the collimating element 1 is of a generally bulged shape. Its front face has a reflective coating 12, which may also be formed on the internal surface of the through holes 16. The coating 12 is preferably aluminium-based. The collimating element 1 itself is opaque. It is mechanically robust and, as will be seen from the foregoing description, it constitutes a reflector formed as a light guide with specially adapted front and rear faces, the front face having an optical function while the rear face has a mechanical support function.

In this example the bands 20 have a cylindrical surface profile, and they all extend parallel in cross section in a common direction B (see FIG. 4). Similarly therefore, the fingers or thongs 42 in this example also have a cylindrical shape after they have been deformed permanently. This deformation is carried out either with the aid of a suitable tool while the support element 4 is soft, or with the aid of the optical element 1 when the support element 4 is in a semi-rigid state.

It will be appreciated that it is easy to form the collimating optical element 1, and that stripping of the holes 16 from the mould poses no particular problem since these holes are of flared shape, which may be that of a surface of revolution of conic section. In this context, a conic section means a curve (such as an ellipse, a parabola, or a hyperbola for example) corresponding to the geometrical locus of the points for which the ratio of the distance from a focal point to the distance from a line referred to as a directrix has a given value. The holes 16 define a network of holes which, like the network of diodes 3, is three-dimensional.

The size of the front end 18 of each through hole 16 varies according to its position in the display. It is of course possible to space the holes 16 apart from each other by a greater or lesser amount, according to their position on the display, so as to give the best possible optical effect. Thus, as shown in FIG. 5, the axes of the holes 16 are inclined at an angle A, which varies according to the position of the hole in the display.

The diodes 3 generally define a matrix and a three-dimensional network of diodes as shown in FIG. 1. They may be arranged to emit coloured light, for example red or orange, and the collimating optical element 1 is overlaid with a transparent member 5 which may be coloured, for example in a smoked colour, or in a plurality of colours such as amber or red, in accordance with the requirements of the manufacturer.

Besides the diodes 3, the electronic circuit may include power components, connecting elements, microprocessors, and components for emitting and/or receiving infra-red radiation. It is thus possible to provide a multiplexed control for illumination of the indicating displays, and for display of a character such as a letter, figure or symbol, simply by appropriate illumination of appropriate diodes 3.

As will have been understood, especially from the foregoing description and from the drawings, the diodes 3 may be located exactly at the focus of the corresponding through holes 16, in such a way that the display gives a high optical performance. After the fingers or thongs 42 have been deformed, the diodes 3 are sandwiched between the latter and the bands 20 of the collimating element 1.

Figure 3:
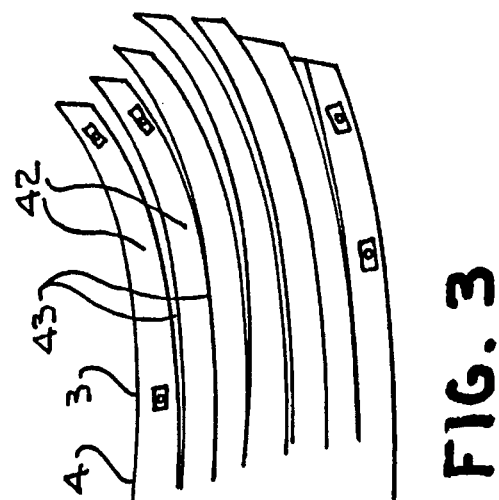
FIG. 3 is a view similar to FIG. 2 after permanent deformation of the fingers.

The present invention is of course not limited to the embodiment described above. In particular, the fingers 42 may extend in both directions away from the root portion 41 of the support element 4, and the position of the root portion will depend on particular applications. As shown in FIGS. 2 and 3, the root portion 41 is arranged at one end of the support element 4, but it will be understood that it can of course be arranged in the middle of the latter.

The support element may have a plurality of root portions. In this connection reference is now made to FIG. 7, in which the support element is indicated by the reference numeral 140. In this example, the support element 140 has two root portions 141 and 142, together with three sets of fingers or thongs in the form of strips 145, 143, 144. The strips 143 extend between the two root portions 141 and 142, while the strips 144 and 145 are in the form of fingers having free ends extending in cantilevered fashion away from the respective root portions 142 and 141.

All of the foregoing depends on the shape of the indicating display. The width of at least one finger or strip may change from one end of the finger to the other, as may their length (see for example the strips 144 in FIG. 7). Their width may simply vary as between one finger and another. The same is true in respect of their length, which is governed generally by the designed shape of the display.

The bands 20 and the fingers 42 may extend horizontally as shown in FIG. 1, but on the other hand they may alternatively extend vertically or obliquely.

The support element 4 may be made by moulding, and may be without the fingers 42, so that it defines an image of the optical collimating element 1, that is to say it has stepped portions, complementary to the steps 41 and facing towards the latter.

The optical element 1 may serve for securing the indicating display on to the bodywork of the vehicle. It may for example be of hollow shape, with, on its rear face, a peripheral flange which envelops the support element 4 and which is provided with fastening means for securing it to the bodywork. In that case, the support element 4 is secured to the optical element 1 by means of its root portion 41 or root portions 141, 142.

The support element 4 may of course also be of hollow shape, having on its rear face a securing flange for fastening the indicating display to the bodywork of the vehicle. In this case its base is divided into fingers or thongs that are surrounded by the said securing flange. The optical collimating element is then secured to the support element 4 by means of the securing flange, and also to the transparent member 5.

As mentioned above, the support element 4 is preferably made of a semi-rigid material, so that the optical element 1 constitutes a template for the support element 4, with the fingers 42 being deformed so as to follow the shape of the bands 20 by cooperation of the diodes 3 with the bands 20.

The support element 4 can of course be made of a more flexible material, but in that case a separate special template must be provided for shaping it.

What is claimed is:

1. An optical collimating element for a motor vehicle indicator display comprising said collimating element, a support element associated with the collimating element, and electroluminescent diodes carried by the support element, wherein the collimating element defines an inner face which is formed with steps and the collimating element further having through holes, each of which is open into a said step to define a seating surface which mechanically engages a said diode, each said diode being shaped so that engagement of said diode with said seating surface centers said diode in said through hole.

2. A collimating element according to claim 1, wherein each said step defines a band, with each said through hole being open into a said band.

3. A collimating element according to claim 2, wherein said bands define a cylindrical surface, the element defining a common direction with all the bands, in cross section, extending parallel to said direction.

4. A collimating element according to claim 1, wherein each said through hole is flared.

5. In combination with a collimating element according to claim 1, said support element formed with a plurality of fingers for supporting said diodes, wherein the dimensions of said fingers are adapted to those of said steps of the collimating element.

6. An indicator display comprising a collimating element and support element in combination according to claim 5, and further comprising a plurality of electroluminescent diodes sandwiched between said steps and said fingers.

7. A collimating element according to claim 1, wherein said collimating element has a front face opposite to said rear face, said front face being inclined with respect to three reference planes which are mutually perpendicular with respect to one another.

* * * * *